United States Patent [19]

Kobushi et al.

[11] Patent Number: 4,954,454
[45] Date of Patent: Sep. 4, 1990

[54] METHOD FOR FABRICATING A POLYCRYSTALLINE SILICON RESISTOR

[75] Inventors: Kazuhiro Kobushi, Osaka; Shuichi Kameyama, Itami; Tadao Komeda, Ikoma, all of Japan

[73] Assignee: Matsushita Electric Industrial Co., Ltd., Osaka, Japan

[21] Appl. No.: 374,608

[22] Filed: Jun. 30, 1989

Related U.S. Application Data

[63] Continuation of Ser. No. 131,739, Dec. 11, 1987, abandoned.

[30] Foreign Application Priority Data

Dec. 16, 1986 [JP] Japan ................................ 61-299436
Dec. 16, 1986 [JP] Japan ................................ 61-299437

[51] Int. Cl.$^5$ ............................................ H01L 21/265
[52] U.S. Cl. ......................................... 437/21; 437/24; 437/27
[58] Field of Search .......................... 437/21, 24, 27

[56] References Cited

U.S. PATENT DOCUMENTS

| | | | |
|---|---|---|---|
| 4,617,066 | 10/1986 | Vasudev | 437/27 |
| 4,659,392 | 4/1987 | Vasudev | 437/24 |
| 4,682,407 | 7/1987 | Wilson et al. | 437/24 |
| 4,753,895 | 6/1988 | Mayer et al. | 437/21 |

*Primary Examiner*—Brian E. Hearn
*Assistant Examiner*—Andrew Griffis
*Attorney, Agent, or Firm*—Wenderoth, Lind & Ponack

[57] ABSTRACT

A method for fabricating a semiconductor device which is capable of enlarging diameter of crystal grain of a polycrystalline conductor by a heat treatment which is carried out after surface lower portion of the polycrystalline conductor is made amorphous with ion-implanting atoms in the polycrystalline conductor by predetermined accelerating energy to thereby improve the uniformity of size of crystal grain. By this method, the uniformity of impurity concentration distribution is improved in the polycrystalline conductor and also in the impurity diffusion area, and further, the uniformity of resistance of a resistor or conductor formed by the polycrystalline conductor is improved.

5 Claims, 3 Drawing Sheets

METHOD FOR FABRICATING A POLYCRYSTALLINE SILICON RESISTOR

This application is a continuation of now abandoned application, Ser. No. 07/131,739 filed on Dec. 11, 1987, now abandoned.

BACKGROUND OF THE INVENTION

This invention relates to a method for fabricating a semiconductor device and, more particularly to a method which is capable of improving uniformity of distribution of impurity concentration in a polycrystalline conductor as a diffusion source, a resistor or a conductor.

Generally, it is necessary to form shallow junctions by way of impurity diffusion in order to obtain a semiconductor device with high performance. For example, one of the conventional methods for forming shallow junctions is as follows. A polycrystalline semiconductor thin film is deposited on a semiconductor substrate, and then, the impurity is ion-implanted into the thin film, and thereafter, heat treatment is carried out to diffuse the impurity into the semiconductor substrate, so that the desired shallow impurity diffusion area is formed. Another method by which a resistor with high performance can be obtained is as follows. A polycrystalline semiconductor thin film is deposited on an dielectric substrate, and then, the impurity is ion-implanted into the thin film, and thereafter, heat treatment is carried out and patterning is then carried out through photolithography and etching stages, so that the desired resistor can be formed.

Generally, the size of crystal grains forming polycrystalline conductive film readily varies in the surface of the semiconductor substrate since thermal distribution at the reaction portion becomes non-uniform or infrared rays are reflected on the surface of the semiconductor substrate when the polycrystalline conductive film is deposited. Therefore, once impurity atoms are implanted in such a polycrystalline conductive film, a part of the atoms are supplied to the border of crystal grains, i.e., crystal grain field because of the heat treatment carried out after the implantation, and then are deactivated. In an area of small crystal grains the size of crystal grain field is large so that a lot of impurity atooms are deactivated, and in an area of large crystal grains, the size of crystal grain field is small so that most of the impurity atoms are uniformly distributed into crystal grains and are activated. Therefore, if the size of the crystal grain of polycrystalline conductive film is not uniform, the impurity concentration distribution in the polycrystalline conductive film becomes non-uniform, and thereby, the concentration distrubution of impurity which is diffused into the semiconductor substrate from the film becomes non-uniform. That is, a junction with bad homogeneity is formed. In the case where the film is used as a resistor, the resistance of the resistor becomes non-uniform. This phenomenon decreases yield in manufacturing and the quality of the products.

A pre-annealing method in which the heat treatment is applied to the polycrystalline conductive film before atoms which determine the conductively type are ion-implanted so that the size of crystal grain is made larger and unified, is disclosed in "Journal of Electrochemical Society", Vol. 131, No. 1, pp. 216-217, but has several drawbacks as follows. In the method, the heat treatment of high temperature over 1,000° C. is necessitated to obtain sufficient uniformity. Thereby, there may occur re-distribution of impurities in another impurity diffusion layer which was already formed, and there may occur defects due to stress so that it is not preferable to apply the method to actual processes for fabricating semiconductor devices.

Further, "Journal of Vacuum Science Technology B", Vol. 2, No. 4, pp. 698-706 discloses that in the heat treated polycrystalline conductive film, the closer to a surface opposite the surface which contacts the substrate, the larger the size of the crystal grain becomes are therefore, uniformity is obtained. If such an idealized crystal phase exists, after amorphizing a surface opposite to a surface which contains the substrate by a conventional way of impurity ion implantation, fine crystal grains of the polycrystalline conductive film located near a surface which contacts the substate, may function as seeds and recrystallize the polycrystalline conductive film because of the heat treatment, so that the size of crystal grain becomes non-uniform and, it becomes difficult to obtain high uniformity of impurity concentration distribution.

SUMMARY OF THE INVENTION

The present invention, therefore, has as its principal object the provision of an improved method for fabricating semiconductor device which is capable of solving the above-stated drawbacks.

Another object of the invention is to provide an improved method in which crystal grains of polycrystalline conductive film having ion implanted atoms, are enlarged to improve the uniformity of crystal grain size by a pre-annealing below 1,000° C., and to thereby improve the uniformity of impurity concentration distribution in the impurity diffusion area.

Still another object of the invention is to provide an improved method in which crystal grains of polycrystalline conductive film, in which are ion implanted atoms, are enlarged to improve the uniformity of crystal grain size by a pre-annealing, and to thereby improved the uniformity of resistance of a resistor or a conductor formed by the film.

These and other objects are accomplished according to the present invention, by a method for fabricating a semiconductor device which comprises ion-implanting first atoms which do not determine conductivity type, without making a surface which does not contact a substrate amorphous, applying a heat treatment to a semiconductor thin film which does not contain the first atoms applying second atoms which determine the conductivity type into the semiconductor thin film heat treated, and applying a heat treatment to the semiconductor thin film which contains the second atoms.

While the novel features of the invention are set forth with particularity in the appended claims, the invention, both as to organization and content, will be better understood and appreciated, along with other objects and features thereof, from the following detailed description taken in conjunction with the drawings.

DETAILED DESCRIPTION OF THE INVENTION (Example 1)

The following is one of the examples of the invention in which a shallow impurity diffusion area is formed by use of polysilicon as a diffusion source.

A polysilicon thin film of approximately 300 nm thickness is deposited on a semiconductor substrate by use of a low pressure CVD method with reaction temperature of 610° C., and silicon of $1 \times 10^{15}$ cm$^{-2}$ is ion-implanted into a polysilicon thin film with acceleration voltage of 70 kV. Then, the heat treatment with temperature of 800° C.–1,000° C. is applied for 30 minutes to the polysilicon thin film into which silicon was ion-implanted under the atmosphere of N$_2$ gas. Thereafter, boron of $1 \times 10^{15}$ cm$^{-2}$ is ion-implanted into the polysilicon thin film with an acceleration voltage of 40 kV or arsenic of $1 \times 10^{16}$ cm$^{-2}$ is ion-implanted with an acceleration voltage of 160 kV. Thereafter, a 30 minute heat treatment is carried out with a temperature of 950° C. under an atmosphere of N$_2$ gas. By carrying out the above-stated series of steps, the desired impurity diffusion source is formed.

Since silicon ions, i.e., ions which do not determine the conductivity type cause the surface lower portion of polysilicon to be made amorphous, keeping the state of the surface polycrystalline, the diameter of crystal grain of polysilicon is effectively enlarged even by preannealing with temperature of 1,000° C. and less, and grows to 500 nm–1 μm which is several times larger than that in case of the conventional method, and also is unified so that a uniform impurity diffusion area is formed.

(EXAMPLE 2)

The following is a second example in which a resistor is formed by use of polysilicon. This example is explained with reference to FIGS. 3A through 3C.

Figure 3A:
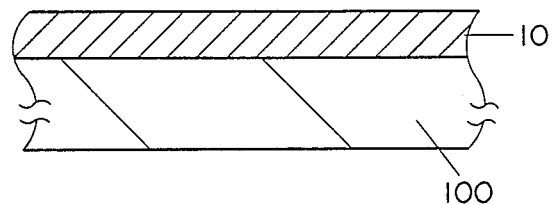
Figure 3B:
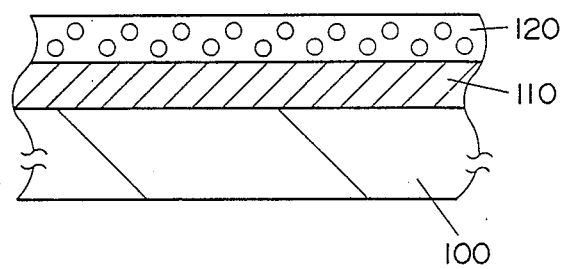

(I) A surface of a monocrystalline semiconductor substrate 100 is oxidized so that oxide film 110 of approximately 600 nm thickness is formed [FIG. 3A].

(II) Then, a polysilicon thin film 120 of approximately 300 nm thickness is deposited on the semiconductor substrate by use of the low pressure CVD method with reaction temperature of 610° C., and silicon of $1 \times 10^{15}$ cm$^{-2}$ is ion-implanted into a polysilicon thin film 120 with acceleration voltage of 70 kV. Thereafter, heat treatment (preannealing) is applied for 30 minutes to the polysilicon thin film 120 into which silicon was ion-implanted, with temperature of 800° C.–1,000° C. under the an atmosphere of N$_2$ gas. Then, boron of $1 \times 10^{15}$ cm$^{-2}$ is ion-implanted into the polysilicon thin film 20 with acceleration voltage of 40 kV, or arsenic of $1 \times 10^{16}$ cm$^{-2}$ is ion-implanted with acceleration voltage of 160 kV. Thereafter, helat treatment is carried out for 30 minutes with a temperature of 950° C. under an atmosphere of N$_2$ gas [FIG. 3B].

Figure 3C:
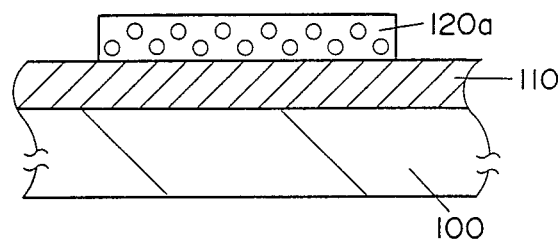

(III) A resist pattern of resistor is formed on polysilicon Thin film 120 to which the heat treatment was applied at photo-mask step, and the polysilicon thin film 120 is etched so that resist is removed to thereby form resistor 120a [FIG. 3C].

By the above-stated series of steps, the desired resistor is formed.

To make a comparison of characteristics, conventional method is carried out as follows. Right after a polysilicon thin film of approximately 300 nm thickness is deposited, by use of low pressure CVD method with reaction temperature of 610° C., on a semi-conductor substrate whose surface is oxidized, boron of $1 \times 10^{15}$ cm$^{-2}$ is implanted into the polysilicon thin film with acceleration voltage of 25 kV or arsenic of $1 \times 10^{16}$ cm$^{-2}$ is implanted with acceleration voltage of 60 kV. Thereafter, heat treatment is carried out for 30 minutes with temperature of 950° C. under the an atmosphere of N$_2$ gas.

Figure 1:
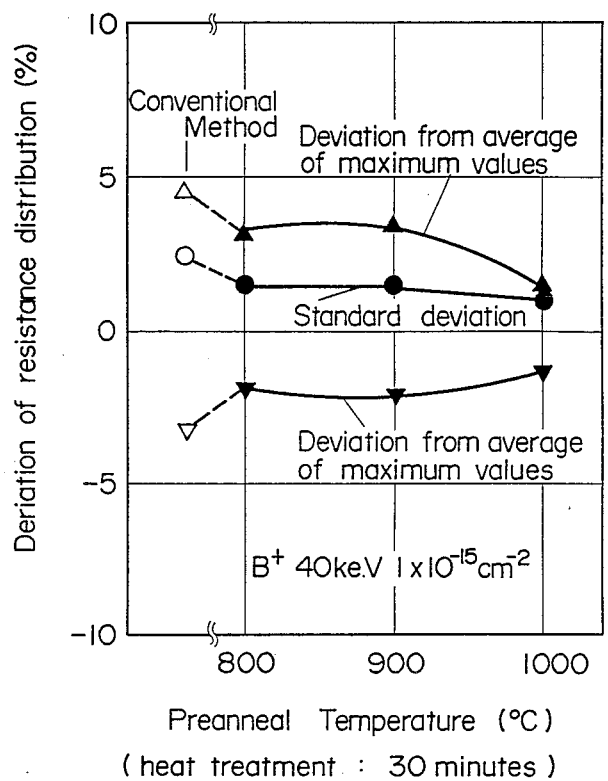
FIG. 1 shows a characteristic of resistance distribution in a polysilicon thin film with boron implanted.
Figure 2:
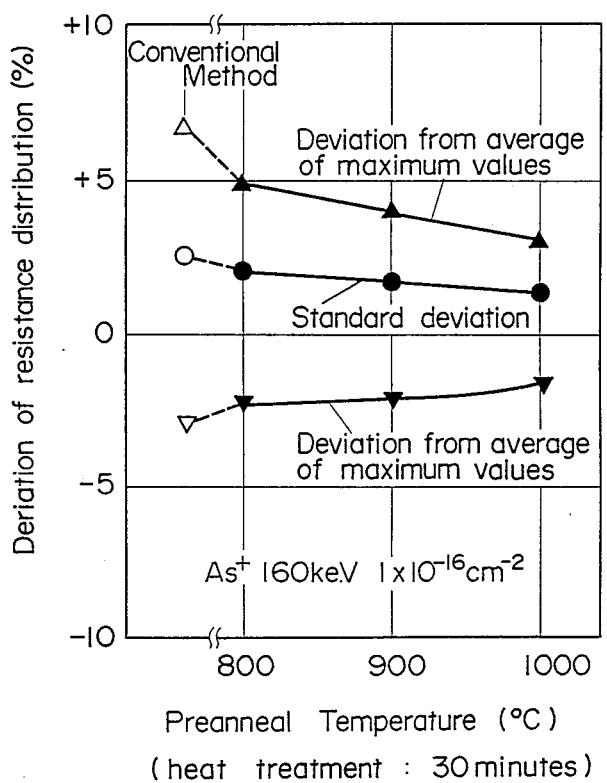
FIG. 2 shows a characteristic of resistance distribution in a polysilicon thin film with arsenic implanted; and, FIG. 3A –3C are sectional views showing one of the embodiments of the invention.

As to a first material manufactured by the invention method, and a second material manufactured by the conventional method, uniformity of resistance is evaluated by measuring sheet resistance at 45 points on the polysilicon thin film. FIG. 1 shows the deviation of resistance distribution in the polysilicon thin film as to the first and second materials in case of boron implantation, and FIG. 2 shows the deviation of resistance distribution in the polysilicon thin film as to the first and second materials in the case of arsenic implantation. In each case, it is apparent that the deviation decreases in the invention more than that of the conventional one. In particular, the deviation of one to which preannealing of 1,000° C. was applied becomes a half ~ a third.

In the above Examples 1 and 2, atoms which do not determine conductivity type, i.e., silicon as same atoms as those forming a polycrystalline conductor are ion-implanted to make the amorphous state. However, atoms which are different from atoms forming a polycrystalline conductor can be used if they do not affect the control of conductivity type of the polycrystalline conductor. Therefore, it is possible to implant inert elements instead of same atoms as those forming a polycrystalline conductor. The reason why atoms which do not determine the conductivity type are used is that diameter of crystal grain of a polycrystalline conductor is enlarged to be unified. If there are no errors for concentration control of the impurity which determines the conductivity type or a little bit of error can be allowed, atoms which determine the conductivity type can be used for that purpose.

IF preannealing or final heat treatment is carried out for a larger period in the above Examples 1 and 2, it is possible to make the diameter of the crystal grain larger so that higher performance can be obtained. For example, upon forming the impurity diffusion area, if the diameter of crystal grain of the polycrystalline conductor becomes sufficiently larger than the size of a contact surface between the polycrystalline conductor and the monocrystalline substrate area, as a result of longer time-heat treatment, the polycrystalline conductor film can connect with the single-crystalline substrate area through only one crystal grain of the polycrystalline conductor film.

In this case, the crystal grain field does not exist at a portion of the polycrystlline conductive film which contacts the contact surface, so that it exists in a state similar to that which monocrystalline conductive film is connected.

Since the impurity is not activated in the crystal grain field, its resistance is high. Therefore, it becomes possible to reduce the contact resistance by contacting a single crystal, gain with a monocrystal and also to reduce wiring resistance including the thus formed impurity diffusion area and interconnection area. Further, in the case where a metal or alloy of metal and semiconductor is used as material of interconnection area, the metal is extraordinarily diffused through the crystal grain field, and enters into the monocrystalline substrate area beyond the interface, so that reliability is decreased, but the crystal grain field does not exist at the polycrystalline conductive film portion which contacts the interface so that extraordinary diffusion of metal is suppressed and the reliability is improved.

While specific embodiments of the invention have been illustrated and described herein, it is realized that modifications and changes will occur to those skilled in the art. It is therefore to be understood that the appended claims are intended to cover all modifications and changes as fall within the true spirit and scope of the invention. Appended claims are intended to cover all modifications and changes as fall within the true spirit and scope of the invention.

What we claim is:

1. A method for fabricating a polycrystalline silicon resistor comprising the steps of:

forming a dielectric film on a substrate;

forming a polycrystalline silicon film on said dielectric film;

ion-implanting first atoms which do not determine conductivity type into said polycrystalline silicon film without making a surface of said polycrystalline silicon film, which does not contact said dielectric film, amorphous;

applying a first heat treatment to said polycrystalline silicon film which contains said first atoms which do not determine conductivity type, to substantially increase the uniformity of distribution of said first atoms in said polycrystalline silicon film and to substantially increase the crystal grain size and uniformity of said polycrystalline silicon film;

applying second atoms which determine conductivity type into said polycrystalline silicon film which said heat treatment is applied to; and applying a second heat treatment to said polycrystalline silicon film which contains said second atoms to substantially increase the uniformity of distribution of said second atoms in said polycrystalline silicon film and wherein said polycrystalline silicon film is patterned and used as a resistor on said dielectric film.

2. The method of claim 1, wherein said second atoms are applied without making the surface of said polycrystalline silicon film, which does not contact said dielectric film, amorphous.

3. The method of claim 1, wherein said first atoms are of silicon or the inert elements.

4. The method for claim 1, wherein said first heat treatment is applied at temperature in the range 800°–1000° C., for about 30 minutes.

5. The method of claim 1, wherein said second heat treatment is applied at temperature in the range 800°–1000° C. for about 30 minutes.

* * * * *